(12) United States Patent
Huang et al.

(10) Patent No.: US 8,329,360 B2
(45) Date of Patent: Dec. 11, 2012

(54) METHOD AND APPARATUS OF PROVIDING OVERLAY

(75) Inventors: Guo-Tsai Huang, Sanchong (TW);
 Fu-Jye Liang, Kaohsiung (TW); Li-Jui Chen, Hsinchu (TW); Chih-Ming Ke, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 12/631,591

(22) Filed: Dec. 4, 2009

(65) Prior Publication Data
 US 2011/0133347 A1   Jun. 9, 2011

(51) Int. Cl.
 *G03F 1/00* (2006.01)
 *H01L 21/66* (2006.01)
(52) U.S. Cl. .......... 430/5; 430/22; 257/620; 257/767; 257/797; 257/E21.525; 257/E21.532; 257/E23.179; 356/401; 382/151; 438/401; 438/462; 438/800; 438/975
(58) Field of Classification Search ............... 430/5, 22; 257/620, 767, 797, E21.525, E21.532, E23.179; 356/401; 382/151; 438/401, 462, 800, 975
 See application file for complete search history.

(56) References Cited

U.S. PATENT DOCUMENTS

| | | | |
|---|---|---|---|
| 6,610,488 B2 | 8/2003 | Danenberg et al. | |
| 7,180,593 B2 | 2/2007 | Lin | |
| 7,190,824 B2 * | 3/2007 | Chen | 382/151 |
| 7,480,892 B2 | 1/2009 | Chiu et al. | |
| 2005/0069790 A1 * | 3/2005 | Gruss et al. | 430/22 |
| 2006/0039595 A1 * | 2/2006 | Adel et al. | 382/144 |
| 2009/0233191 A1 * | 9/2009 | Marokkey | 430/5 |

FOREIGN PATENT DOCUMENTS

| | | | |
|---|---|---|---|
| JP | 2007-324371 | * | 12/2007 |
| JP | 2007096292 | | 12/2007 |

OTHER PUBLICATIONS

Takashi Saito et al., "Investigation of New Overlay Measurement Marks for Optical Lithography", 1998 American Vacuum Society, J. Vac. Sci. Technol. B 16(6), Nov./Dec. 1998, 0734-211X/9816(6)/3415/4, pp. 3415-3418.
Japanese Patent Office, Office Action dated Apr. 3, 2012, Application No. 2010-158729, 3 pages in Japanese, 3 pages in Chinese.
Chinese Patent Office, Office Action dated Feb. 28, 2012, Application No. 201010249719.0, 4 pages.

* cited by examiner

*Primary Examiner* — Dao H Nguyen
(74) *Attorney, Agent, or Firm* — Haynes and Boone, LLP

(57) ABSTRACT

Provided is an apparatus that includes an overlay mark. The overlay mark includes a first portion that includes a plurality of first features. Each of the first features have a first dimension measured in a first direction and a second dimension measured in a second direction that is approximately perpendicular to the first direction. The second dimension is greater than the first dimension. The overlay mark also includes a second portion that includes a plurality of second features. Each of the second features have a third dimension measured in the first direction and a fourth dimension measured in the second direction. The fourth dimension is less than the third dimension. At least one of the second features is partially surrounded by the plurality of first features in both the first and second directions.

18 Claims, 9 Drawing Sheets

METHOD AND APPARATUS OF PROVIDING OVERLAY

TECHNICAL FIELD

The present disclosure relates generally to a semiconductor device, and more particularly, to an overlay mark used in a photolithography process.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The need for small geometry sizes places stricter demands on a photolithography process. In particular, the alignment between various layers in the semiconductor device (also referred to as overlay) needs to be precise and accurate. In other words, it is desirable to reduce an overlay error. Overlay marks have been used to measure the overlay error. However, as geometry sizes become increasingly small, existing overlay marks may not be able to measure the actual amount of overlay between the layers. Thus, the overlay error measurement results may be skewed, which may lead to more chip failures.

Therefore, while existing overlay marks have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
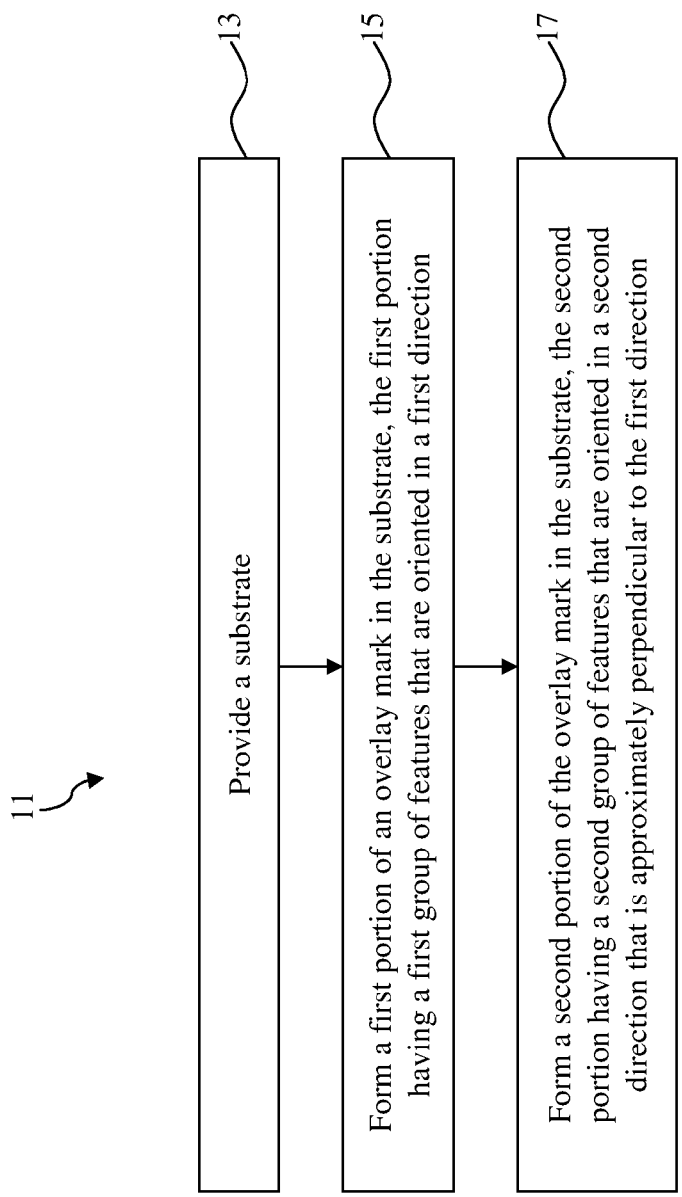
FIG. 1 is a flowchart illustrating a method for fabricating an overlay mark according to various aspects of the present disclosure.

One of the broader forms of the present disclosure involves an apparatus having an overlay mark that includes: a first portion that includes a plurality of first features, each of the first features having a first dimension measured in a first direction and a second dimension measured in a second direction that is approximately perpendicular to the first direction, the second dimension being greater than the first dimension; and a second portion that includes a plurality of second features, each of the second features having a third dimension measured in the first direction and a fourth dimension measured in the second direction, the fourth dimension being less than the third dimension; wherein at least one of the second features is partially surrounded by the plurality of first features in both the first and second directions.

Another of the broader forms of the present disclosure involves an apparatus having an overlay mark that includes: a first overlay mark having a group of elongated first gratings that each extend along a first axis; and a second overlay mark having a group of elongated second gratings that each extend along a second axis that is approximately perpendicular to the first axis; wherein the second overlay mark is partially encircled by the first overlay mark along both the first and second axes.

Yet another of the broader forms of the present disclosure involves a method of fabricating a semiconductor device, the method including: providing a substrate; forming a first portion of an overlay mark in the substrate, the first portion including a plurality of first features, each of the first features having a first dimension measured in a first direction and a second dimension measured in a second direction that is approximately perpendicular to the first direction, the second dimension being greater than the first dimension; and forming a second portion of the overlay mark in the substrate, the second portion including a plurality of second features, each of the second features having a third dimension measured in the first direction and a fourth dimension measured in the second direction, the fourth dimension being less than the third dimension; wherein the forming the first and second portions are carried out in a manner so that at least one of the second features is partially surrounded by the plurality of first features in both the first and second directions.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Illustrated in FIG. 1 is a flowchart of a method 11 of fabricating an overlay mark according to various aspects of the present disclosure. The overlay mark may be disposed within a photomask or may be disposed within a semiconductor wafer. The method 11 begins with block 13 in which a substrate is provided. In an embodiment, the substrate is a semiconductor wafer. In another embodiment, the substrate may include a first photomask and a second photomask. The method 11 continues with block 15 in which a first portion of an overlay mark is formed in the substrate. The first portion of the overlay mark has a first group of features that are oriented in a first direction. The method 11 continues with block 17 in which a second portion of the overlay mark is formed in the substrate. The second portion of the overlay mark has a second group of features that are oriented in a second direction that is approximately perpendicular to the first direction. The first portion of the overlay mark is surrounded by the second portion of the overlay mark.

Figure 2B:
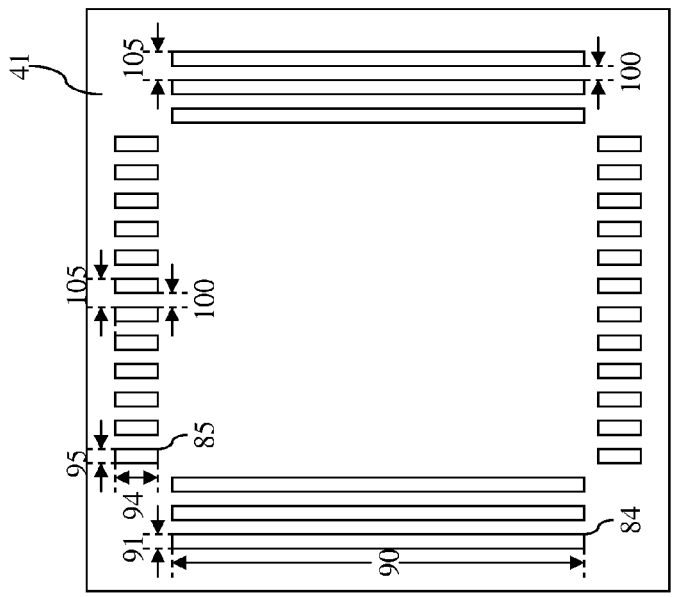
FIGS. 2A and 2B illustrate top views of two exemplary overlay marks fabricated according to the method of FIG. 1, respectively.
Figure 2A:
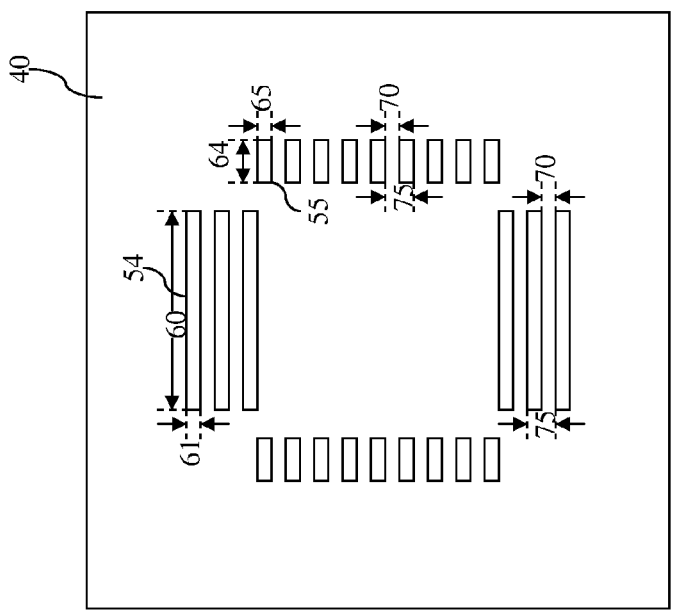

FIGS. 2A and 2B illustrate top views of an overlay mark 40 and an overlay mark 41, respectively. Referring to FIG. 2A, the overlay mark 40 includes a plurality of elongated features (also referred to as lines or gratings) that each extend in an X-direction (or X-axis). In other words, the features are each oriented in the X-direction. For the sake of illustration and to facilitate the ensuing discussions, two of such features are designated at 54 and 55. In the embodiment shown in FIG. 2A, the features 54 and 55 each have an approximately rectangular shape. In other embodiments, the features 54 and 55 may have other shapes, such as curves or squares, or other suitable shapes.

Referring back to FIG. 2A, the features of the overlay mark 40 each have a length that is measured in the X-direction as shown in FIG. 2A, as well as a width that is measured in a Y-direction (or Y-axis) that is approximately perpendicular to the X-direction as shown in FIG. 2A. The widths of these features are approximately equal, but the lengths of the features may vary. As an example, the feature 54 has a length 60 and a width 61, and the feature 55 has a length 64 and a width 65. In the embodiment shown in FIG. 2A, the widths 61 and 65 are approximately equal, and the length 60 is greater than the length 64.

The features of the overlay mark 40 are separated from each other by a distance 70, which is measured in the Y-direction. The distance 70 may also be referred to as the spacing between the features. A pitch 75 of the features (and thus the overlay mark 40) is defined as the sum of the width 61, 65 of one of the features and the distance 70 between the adjacent features. In an embodiment, the width 61, 65 of each of the features and the distance 70 between the adjacent features have a ratio that is approximately 1:1. In other words, the width 61, 65 of each of the features is approximately equal to the distance 70 between the features. In an embodiment, the pitch 75 is in a range from approximately 60 nanometers (nm) to approximately 300 nm, and the widths 61 and 65 and the distance 70 are each in a range from approximately 30 nm to approximately 150 nm. In another embodiment, the pitch 75 is in a range from approximately 15 nm to approximately 75 nm, and the widths 61 and 65 and the distance 70 are each in a range from approximately 7.5 nm to approximately 37.5 nm.

Referring to FIG. 2B, the overlay mark 41 includes a plurality of elongated features (also referred to as lines or gratings) that each extend in the Y-direction. In other words, the features are each oriented in the Y-direction. For the sake of illustration and to facilitate the ensuing discussions, two of such features are designated at 84 and 85. In the embodiment shown in FIG. 2B, the features 84 and 85 each have an approximately rectangular shape. In other embodiments, the features 84 and 85 may have other shapes, such as curves or squares, or other suitable shapes.

Referring back to FIG. 2B, the features of the overlay mark 41 each have a length that is measured in the Y-direction as shown in FIG. 2B, as well as a width that is measured in the X-direction. The widths of these features are approximately equal, but the lengths of the features may vary. As an example, feature 84 has a length 90 and a width 91, and feature 85 has a length 94 and a width 95. In the embodiment shown in FIG. 2B, the widths 91 and 95 are approximately equal, and the length 90 is greater than the length 94.

The features 84, 85 of the overlay mark 41 are separated from each other by a distance 100, which is measured in the X-direction. The distance 100 may also be referred to as the spacing between the features. A pitch 105 of the features (and thus the overlay mark 41) is defined as the sum of the width 91, 95 of one of the features and the distance 100 between the adjacent features. In an embodiment, the width of each of the features and the distance 100 between the adjacent features have a ratio that is approximately 1:1. In other words, the width 91, 95 of each of the features is approximately equal to the distance 100 between the features. In an embodiment, the pitch 105 is in a range from approximately 60 nm to approximately 300 nm, and the widths 91 and 95 and the distance 100 are each in a range from approximately 30 nm to approximately 150 nm. In another embodiment, the pitch 105 is in a range from approximately 15 nm to approximately 75 nm, and the widths 91 and 95 and the distance 100 are each in a range from approximately 7.5 nm to approximately 37.5 nm.

It is understood that the overlay marks 40 and 41 may be collectively referred to as one overlay mark, in which case the overlay marks 40 and 41 each constitute a different portion of the overlay mark. Also, the overlay marks 40 and 41 may be formed on a semiconductor wafer, or on respective photomasks, as will be discussed in more detail below.

Figure 3:
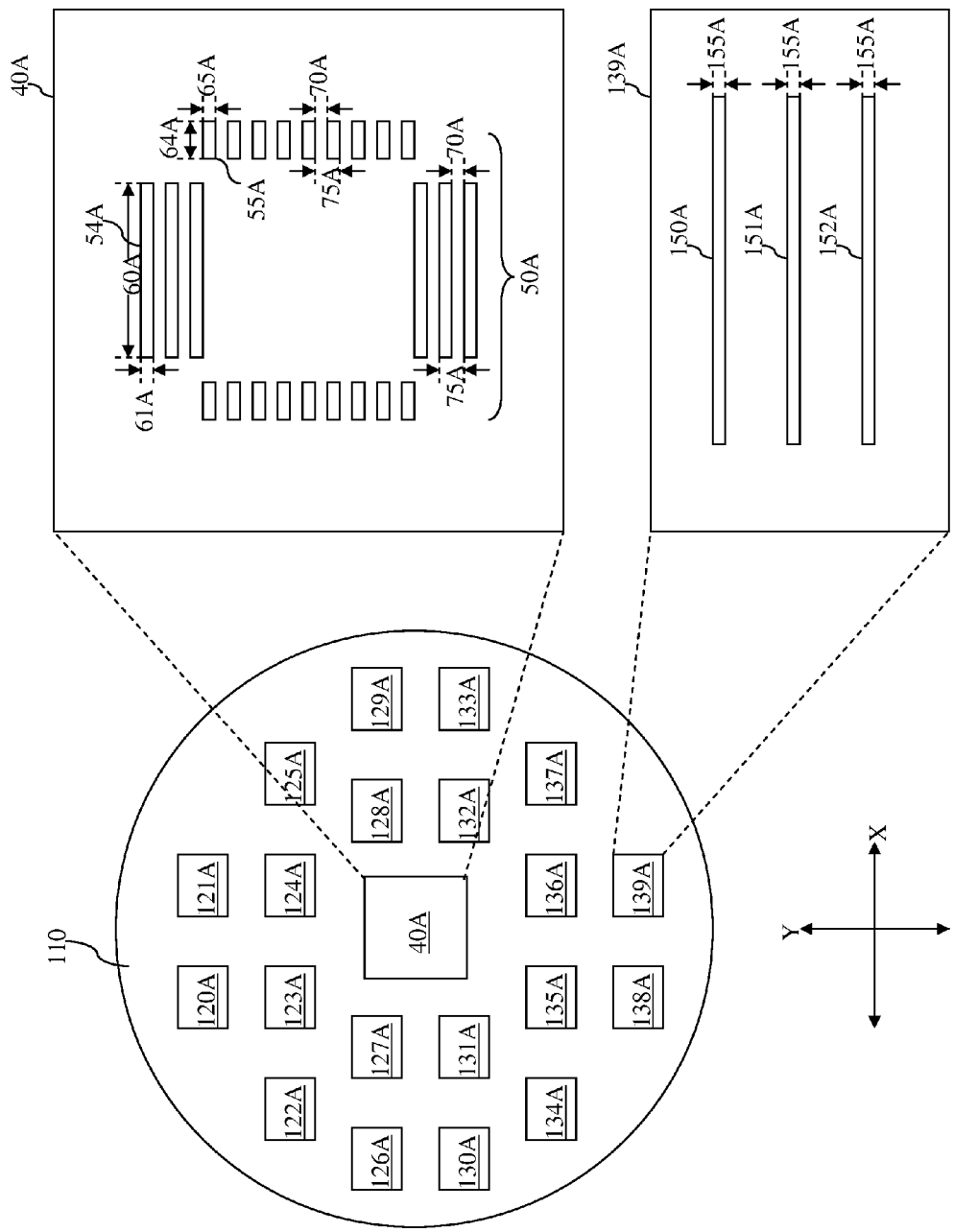
FIG. 3 illustrates a top view of a photomask on which an embodiment of one of the overlay marks of FIG. 2 is implemented.

FIG. 3 illustrates a top view of a photomask 110. The photomask 110 is operable to project a plurality of patterns (or images) to a semiconductor wafer in a photolithography process. In the embodiment shown in FIG. 3, the photomask 110 includes an overlay mark 40A that is an embodiment of the overlay mark 40 of FIG. 2A. Thus, the overlay mark 40A includes elongated features 54A, 55A that are oriented in the X-direction. The photomask 110 also includes patterns 120A-139A that each correspond to different portions of a semiconductor device, or different portions of different semiconductor devices. The semiconductor device(s) may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

For the sake of illustration and comparison, a top view of the pattern 139A is shown in more detail. The pattern 139A includes features 150A, 151A, and 152A that respectively denote portions of a semiconductor device. The features 150A-152A are each oriented in (or extend along) the X-direction—the same direction in which the features 54A, 55A of the overlay mark 40A are oriented. The features 150A-152A each include a width 155A that is measured in the Y-direction. The width 155A is also referred to as a critical dimension, which represents the smallest feature size that can be formed on a substrate in a given semiconductor fabrication technology generation. For example, in a 22-nm fabrication technology generation, the critical dimension is 22 nm, meaning that the smallest semiconductor feature that the 22-nm technology can form is approximately 22 nm. It is understood, however, that the actual value of the width 155A may be larger than 22 nm, since the width 155A represents the critical dimension with respect to the photomask 110, whereas the value of 22 nm may be the value of the critical dimension on a semiconductor wafer that is patterned by the photomask 110. In an embodiment, the dimensions of the patterns on the photomask 110 may be approximately 4 times the dimensions of the patterns on the wafer.

In an embodiment, the critical dimension is the length of a gate of a transistor. The width 155A is correlated to (or is a function of) the pitch 75A of the features 54A, 55A of the overlay mark 40A. In an embodiment, the width 155A is approximately equal to ½ of the pitch 75A. In another embodiment, the width 155A is approximately equal to the width 61A, 65A of the features 54A, 55A of the overlay mark 40A. The features 150A-152A have approximately rectangular shapes in the embodiment shown in FIG. 3, but it is understood that they may have other shapes, such as curves or squares, or other suitable shapes in alternative embodiments.

Figure 4:
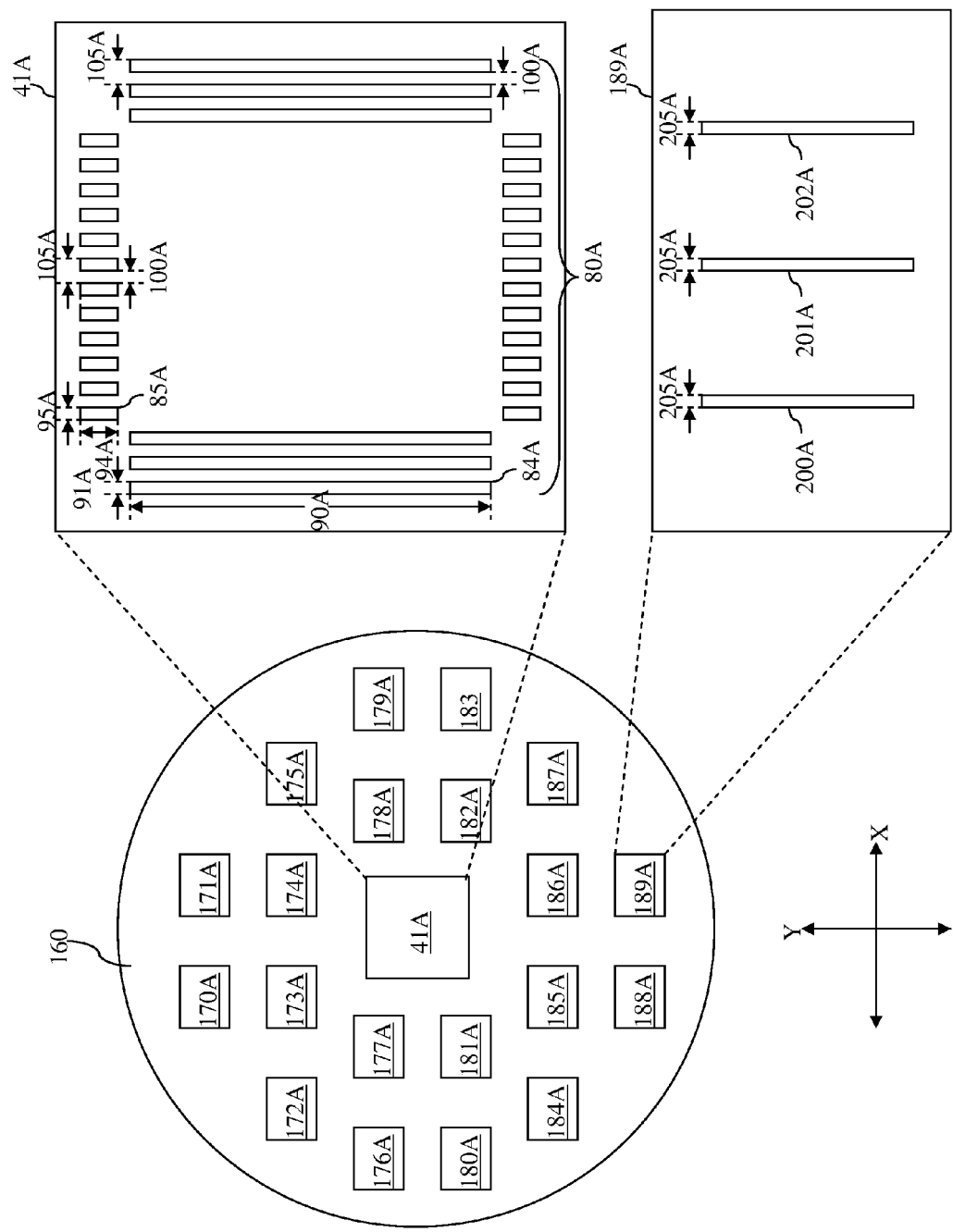
FIG. 4 illustrates a top view of different photomask on which another one of the overlay marks of FIG. 2 is implemented.

FIG. 4 illustrates a top view of a photomask 160. Similar to the photomask 110, the photomask 160 is operable to project a plurality of patterns (or images) to a semiconductor substrate in a photolithography process. In the embodiment shown in FIG. 4, the photomask 160 includes an overlay mark 41A that is an embodiment of the overlay mark 41 of FIG. 2B. Thus, the overlay mark 41A includes elongated features 84A, 85A that are oriented in the Y-direction. The photomask 160 also includes patterns 170A-189A that each correspond to different portions of a semiconductor device, or different portions of different semiconductor devices. The semiconductor device(s) may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. In an embodiment, the patterns 120A-139A of the photomask 110 (FIG. 3) and the patterns 170A-189A of the photomask 160 correspond to the same semiconductor devices, respectively. In that embodiment, the photomasks 110 and 160 may be used in conjunction with each other to fabricate the semiconductor devices.

For the sake of illustration and comparison, a top view of the pattern 189A is shown in more detail. The pattern 189A includes features 200A, 201A, and 202A that respectively denote portions of a semiconductor device. The features 200A-202A are each oriented in (or extend along) the Y-direction—the same direction in which the features 84A, 85A of the overlay mark 41A are oriented. The features 200A-202A each include a width 205A that is measured in the Y-direction. Similar to the width 155A (FIG. 3), the width 205A also represents the critical dimension of a semiconductor fabrication technology generation as discussed above with reference to FIG. 3. The width 205A is correlated to (or is a function of) the pitch 105A of the features 84A, 85A of the overlay mark 41A. In an embodiment, the width 205A is approximately equal to ½ of the pitch 105A. In another embodiment, the width 205A is approximately equal to the width 95A of the features 85A of the overlay mark 41A. In yet another embodiment, the width 205A is approximately equal to the width 155A of the features 150A-152A (FIG. 3). The features 200A-202A have approximately rectangular shapes in the embodiment shown in FIG. 4, but it is understood that they may have other shapes, such as curves or squares, or other suitable shapes in alternative embodiments.

Figure 5:
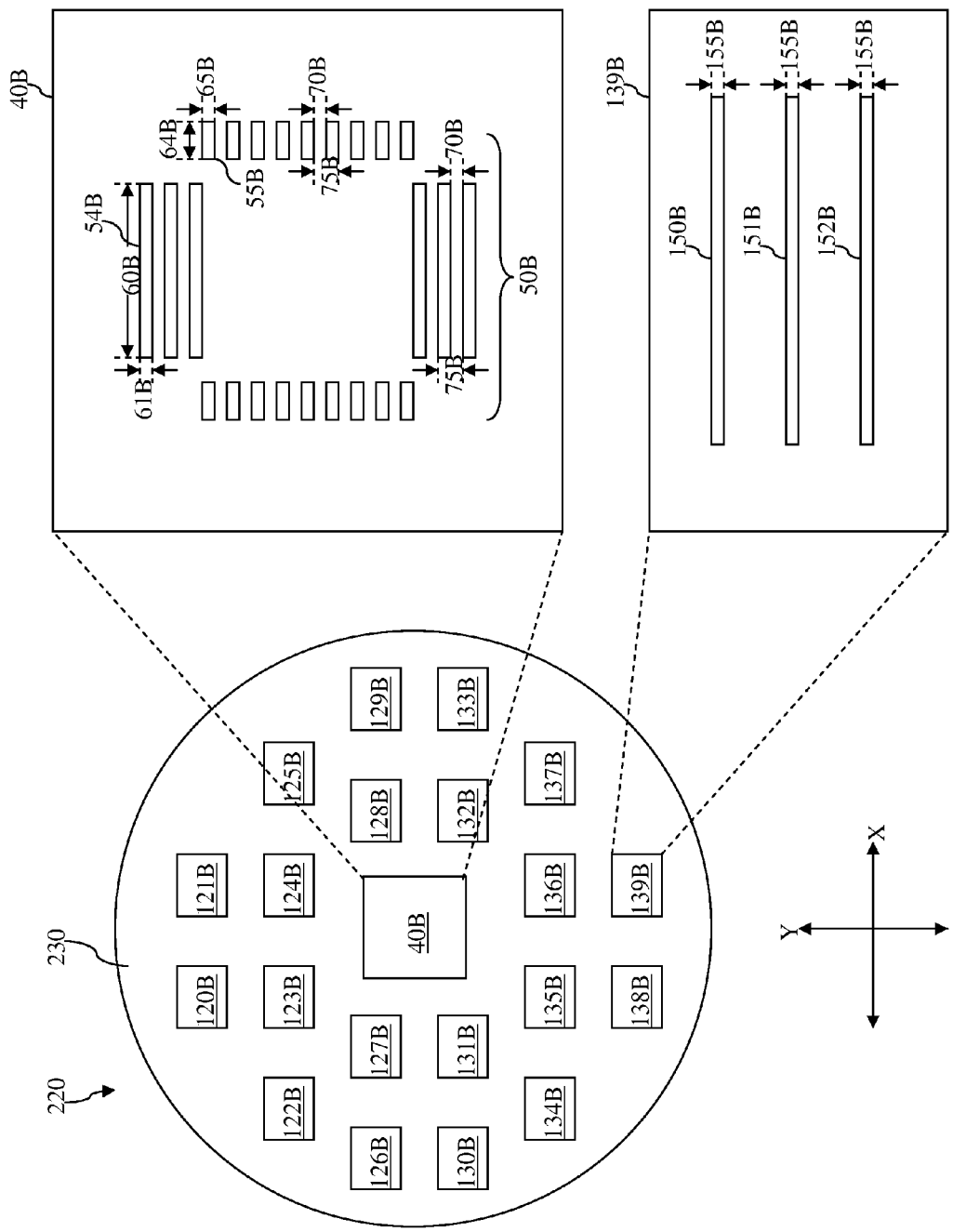
FIGS. 5-6 illustrate top views of a semiconductor wafer at various stages of fabrication according to an embodiment of the method of FIG. 1.
Figure 6:
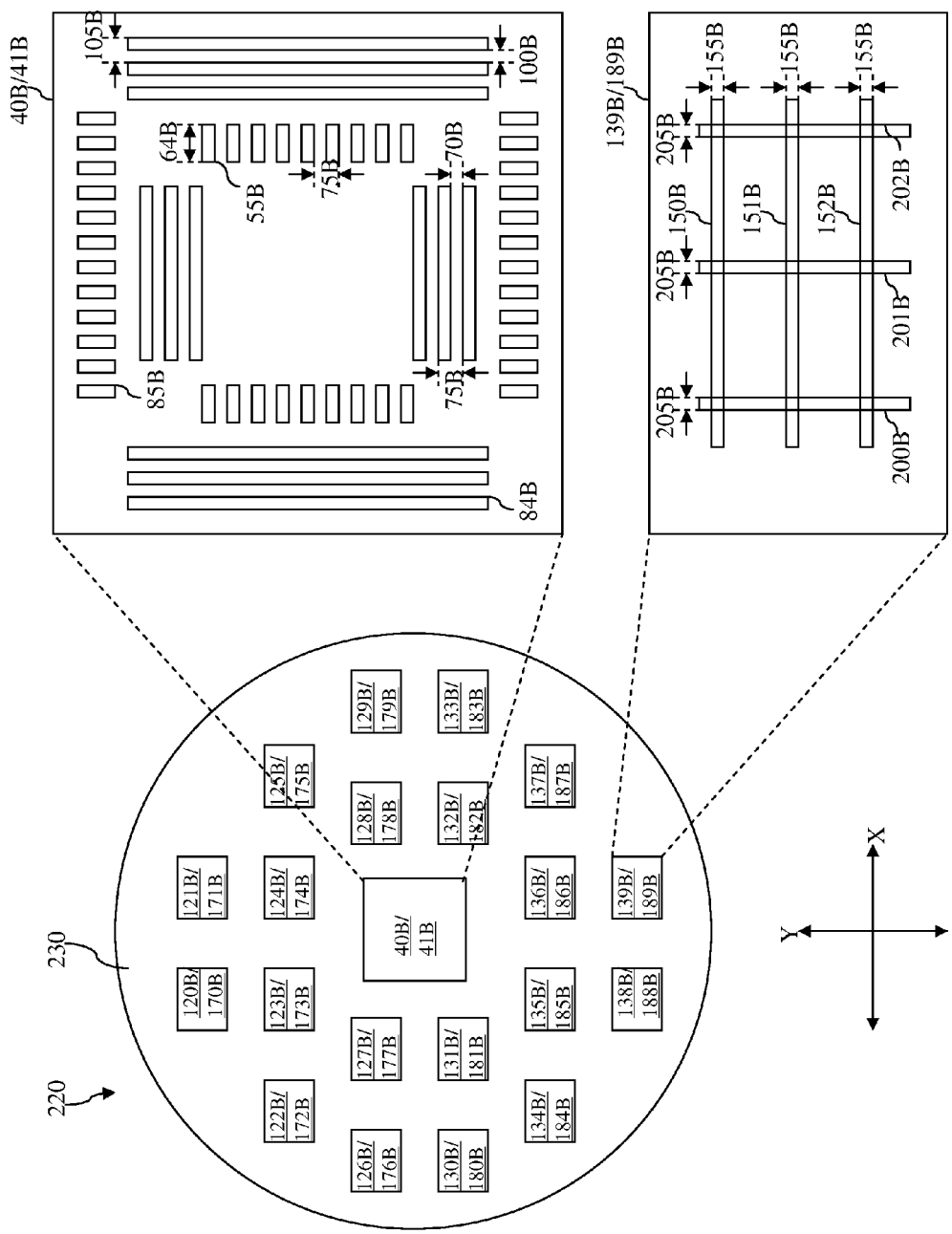

FIGS. 5-6 illustrate top views of a semiconductor wafer 220 (also referred to as a semiconductor substrate) at different stages of fabrication in accordance with an embodiment of the method 11 of FIG. 1. Referring to FIG. 5, the semiconductor wafer 220 is a silicon wafer. In an embodiment, the wafer 220 is doped with a P-type dopant such as boron. In another embodiment, the wafer 220 is doped with an N-type dopant such as phosphorous or arsenic. The wafer 220 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the wafer 220 could include an epitaxial layer (epi layer), may be strained for performance enhancement, and may include a silicon-on-insulator (SOI) structure.

The wafer 220 includes a layer 230. The photomask 110 (FIG. 3) is used in a dipole photolithography process to transfer the patterns 40A and 120A-139A on the photomask to the layer 230 of the wafer 220 to form patterns 40B and 120B-139B, respectively. This dipole photolithography process is performed using dipole-Y apertures, the details of which are illustrated in FIG. 7 and will be discussed in more detail below. The dipole photolithography process may include depositing a photoresist layer on the layer 230; projecting the images of the patterns 40A and 120A-139A onto the photoresist layer to form a patterned photoresist layer; using the patterned photoresist layer as a mask, patterning the layer 230 through an etching process, such as dry etching or wet etching; and removing the photoresist layer after the patterns 40A and 120A-139A are transferred onto the layer 230 as patterns 40B and 120B-139B, respectively. For the sake of simplicity, the details of the dipole photolithography process are not illustrated. And for the sake of illustration, the top views of the patterns 40B and 139B are also shown in detail in FIG. 5. Since the patterns 40B and 120B-130B are formed on the layer 230 at the end of the dipole photolithography process, the layer 230 resembles the photomask 110. It is understood that the physical dimensions of the patterns on the photomask 110 may not be equal to the physical dimensions of the corresponding patterns on the layer 230, though they may have a linear relationship. As an example, the pitch 75A (FIG. 3) may not be equal to the pitch 75B (FIG. 5), but they be directly proportional. In an embodiment, the dimensions of the overlay mark 40B and the patterns 120B-139B in the layer 230 are approximately ¼ of the dimensions of the overlay mark 40A and the respective patterns 120A-139A of the photomask 110. The overlay mark 40B and the patterns 120B-139B formed in the layer 230 may be concave (trenches) or convex (islands).

Referring now to FIG. 6, the photomask 160 (FIG. 4) is used in a dipole photolithography process that is similar to the dipole photolithography process discussed above with reference to FIG. 5. Through this dipole photolithography process, the patterns 41A and 170A-189A of the photomask 160 are transferred to the layer 230 of the wafer 220 to form patterns 41B and 170B-189B, respectively. The dipole photolithography process is performed using dipole-X apertures, the details of which are illustrated in FIG. 7 and will be discussed in more detail below. In the embodiment shown in FIG. 6, the patterns 120B-139B and the patterns 170B-189B partially overlap, respectively. Further, the overlay mark 40B is surrounded (or encircled) by overlay mark 41B. In other embodiments, the patterns 120B-139B and the patterns 170B-189B may not overlap, and the overlay mark 40B may be partially surrounded (or partially encircled) by the overlay mark 41B.

It is understood that the physical dimensions of the patterns on the photomask 160 may not be equal to the physical dimensions of the corresponding patterns on the layer 230, though they may have a linear relationship. As an example, the pitch 105A (FIG. 4) may not be equal to the pitch 105B (FIG. 6), but they be directly proportional. In an embodiment, the dimensions of the overlay mark 41B and the patterns 170B-189B in the layer 230 are approximately ¼ of the dimensions of the overlay mark 41A and the respective patterns 170A-189A of the photomask 160. Moreover, the overlay mark 41B and the patterns 170B-189B formed in the layer 230 may be concave (trenches) or convex (islands).

Figure 7B:
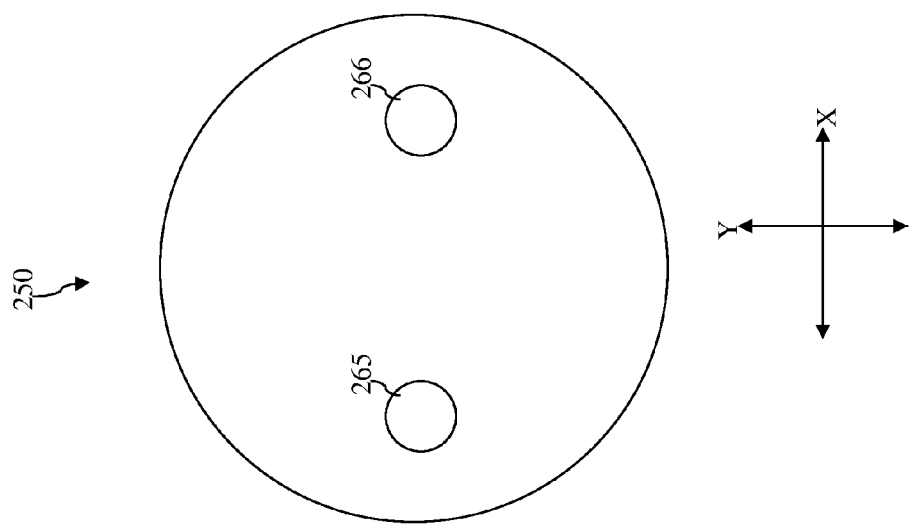
FIGS. 7A and 7B illustrate top views of exemplary dipole-Y aperture and an exemplary dipole-X aperture, respectively, that are used in a photolithography process.
Figure 7A:
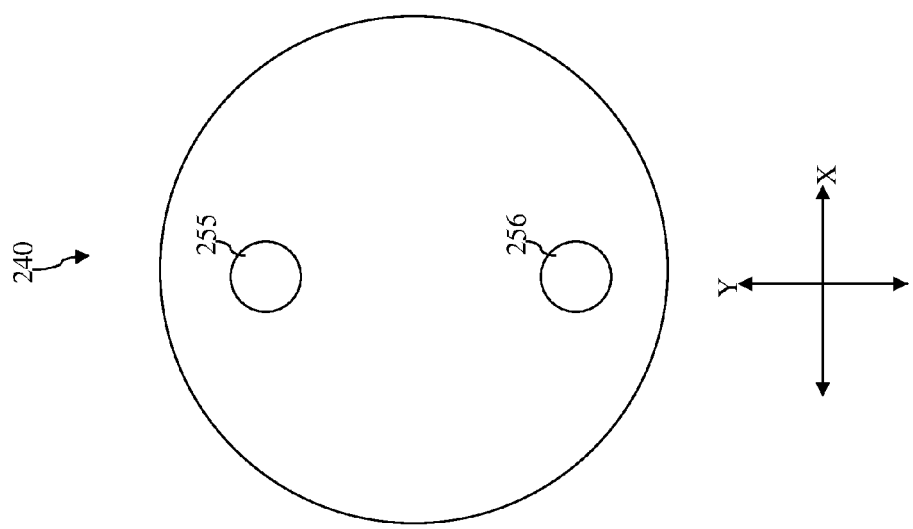

FIGS. 7A and 7B illustrate top views of an exemplary dipole-Y aperture 240 and an exemplary dipole-X aperture 250, respectively. In an embodiment, the dipole-Y aperture 240 is used to perform the dipole photolithography process discussed above with reference to FIG. 5, where the photomask 110 (FIG. 3) is used to form the patterns 40B and 120B-139B on the layer 230. The dipole-X aperture 250 is used to perform the dipole photolithography process discussed above with reference to FIG. 6, where the photomask 160 (FIG. 4) is used to form the patterns 41B and 170B-189B on the layer 230.

The dipole-Y aperture 240 includes openings 255 and 256 that are approximately aligned in the Y-direction, and the dipole-X aperture 250 includes openings 265 and 266 that are approximately aligned in the X-direction. The size and location of the openings 255 and 256 may be tuned to weaken lower-ordered diffractions of light and strengthen higher-ordered diffractions of light in the Y-direction during exposure. The size and location of the openings 265 and 266 may be tuned to weaken lower-ordered diffractions of light and strengthen higher-ordered diffractions of light in the X-direction during exposure. As a result, the dipole-Y aperture 240 enhances the resolution of the X-direction oriented patterns that are formed in the layer 230, for example the features of the overlay mark 40B and the patterns 120B-139B (FIG. 5). The dipole-X aperture 250 enhances the resolution of the Y-direction oriented patterns formed in the layer 230, for example the features of the overlay mark 41B and the patterns 170B-189B (FIG. 6).

If the openings 255, 256, 265, and 266 are integrated onto a single aperture to be used in a single exposure process, the apertures may interfere with each other and degrade the resolution quality of the patterns in the layer 230. Thus, to further improve the resolution of the patterns formed in the layer 230, two separate exposure processes are performed, one exposure process using the aperture 240 and the photomask 110 for the dipole photolithography process discussed with reference to FIG. 5, followed by another exposure process using the aperture 250 and the photomask 160 for the dipole photolithography process discussed with reference to FIG. 6. This is also referred to as a double dipole lithography (DDL) process. As a result, the resolution of the overlay mark 40B and the patterns 120B-139B (FIG. 5) and the resolution of the overlay mark 41B and the patterns 170B-189B (FIG. 6) may be improved by the double dipole lithography process. In a way, this double dipole lithography process described above decomposes a two-dimensional pattern or feature into two one-dimensional patterns or features, which are easier to form—meaning a higher resolution can be achieved for each of the one-dimensional patterns or features.

To accurately perform the double dipole lithography process described above, it is important to minimize the alignment (or overlay) errors between the photomasks 110 and 160, since the photomasks are being used in different exposure processes. Also, since the overlay marks 40B-41B and the patterns 120B-139B and 170B-189B on the layer 230 are patterned using the photomasks 110 and 160, whatever overlay error exists between the photomasks will be transferred to the overlay marks and patterns in the layer 230, albeit with linearly correlated and smaller dimensions. Alternatively stated, the overlay error between the photomasks 110 and 160 will be manifested as an overlay error between the patterns 120B-139B and 170B-189B. The overlay error between the patterns 120B-139B and 170B-189B is proportional to the overlay error between the photomasks 110 and 160 and is smaller.

Hence, after both overlay marks 40B and 41B are formed, an inspection is performed to determine how "centered" (or aligned) the overlay mark 40B is with respect to the overlay mark 41B. The inspection can be performed by measuring an offset distance between the overlay marks 40B and 41B in both the X and Y-directions. However, if the features (e.g. 54B-55B and 84B-85B of FIG. 6) of the respective overlay marks (e.g. 40B and 41B of FIG. 6) are too large in size compared to the other features (e.g. 150B-152B and features 200B-202B of FIG. 6) on the layer 230, the true overlay performance may be difficult to gauge. In some situations, inaccurate overlay may be measured. This is partially due to imperfections of the lenses in the dipole photolithography processes, such as coma aberration—different sensitivity with respect to differently-sized features. In other words, if the overlay marks 40B and 41B have dimensions that are too large in comparison with the dimensions of the features in the patterns 120B-139B and 170B-189B, the measured overlay error will be greater than the true overlay error. Consequently, if engineers attempt to compensate for this false overlay error, the actual overlay performance may be degraded as a result.

As discussed above and illustrated in FIGS. 2-6, the dimensions of the features 54B-55B and 84B-85B of the respective overlay marks 40B and 41B are correlated to the dimensions of the features in the patterns 120B-139B and 170B-189B. In one embodiment, the critical dimensions of the features of the patterns 120B-139B and 170B-189B are approximately equal to ½ of the pitches 75B and 105B, or the widths 61B, 65B, 91B, and 95B, or the distances 70B and 100B, of the overlay marks 40B and 41B, respectively. As such, the overlay marks 40B and 41B are capable of providing a more accurate measurement of the overlay error between the photomasks 110 and 160 during the double dipole lithography processes.

Figure 8:
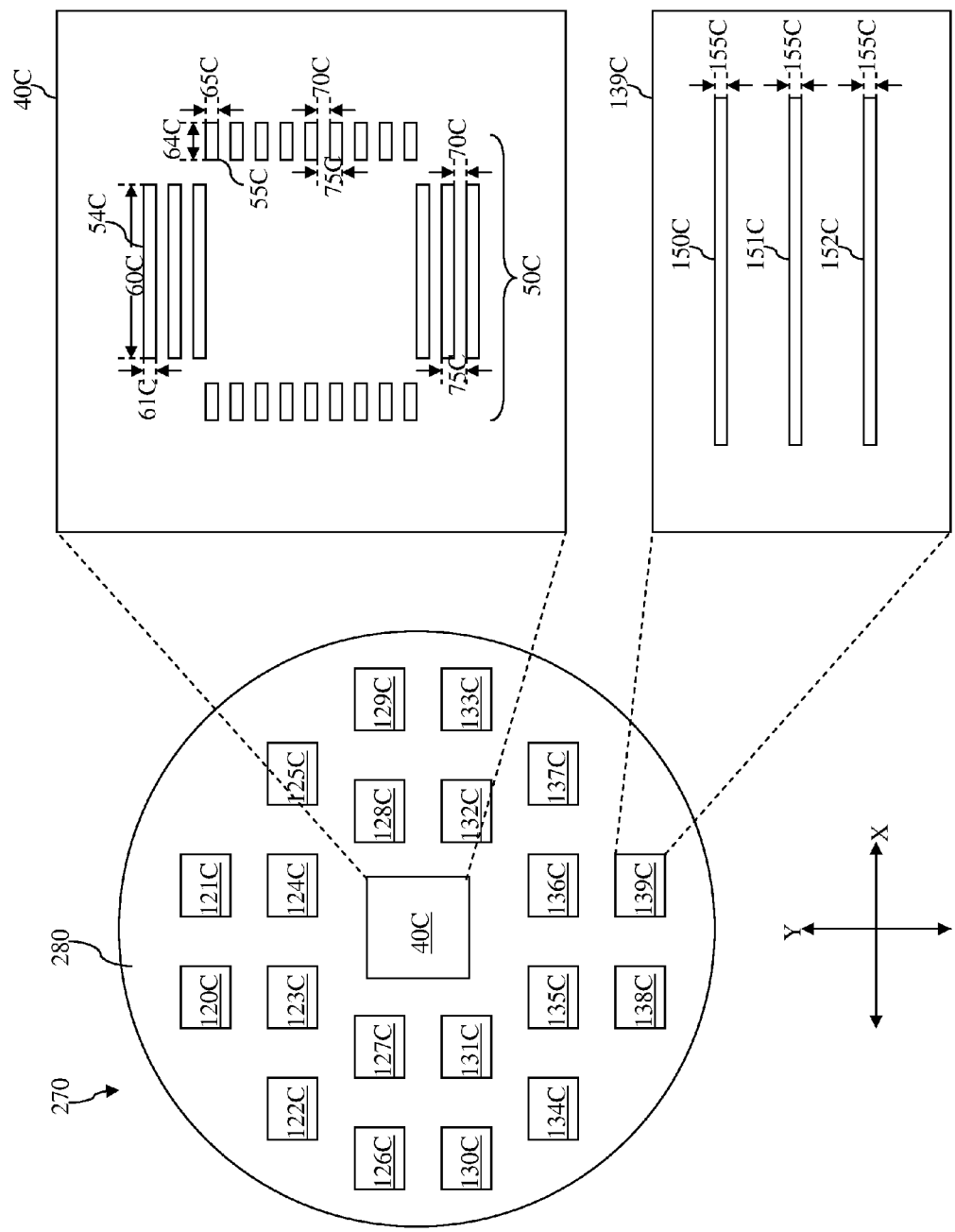
FIGS. 8-9 illustrate top views of a semiconductor wafer at various stages of fabrication according to an alternative embodiment of the method of FIG. 1.
Figure 9:
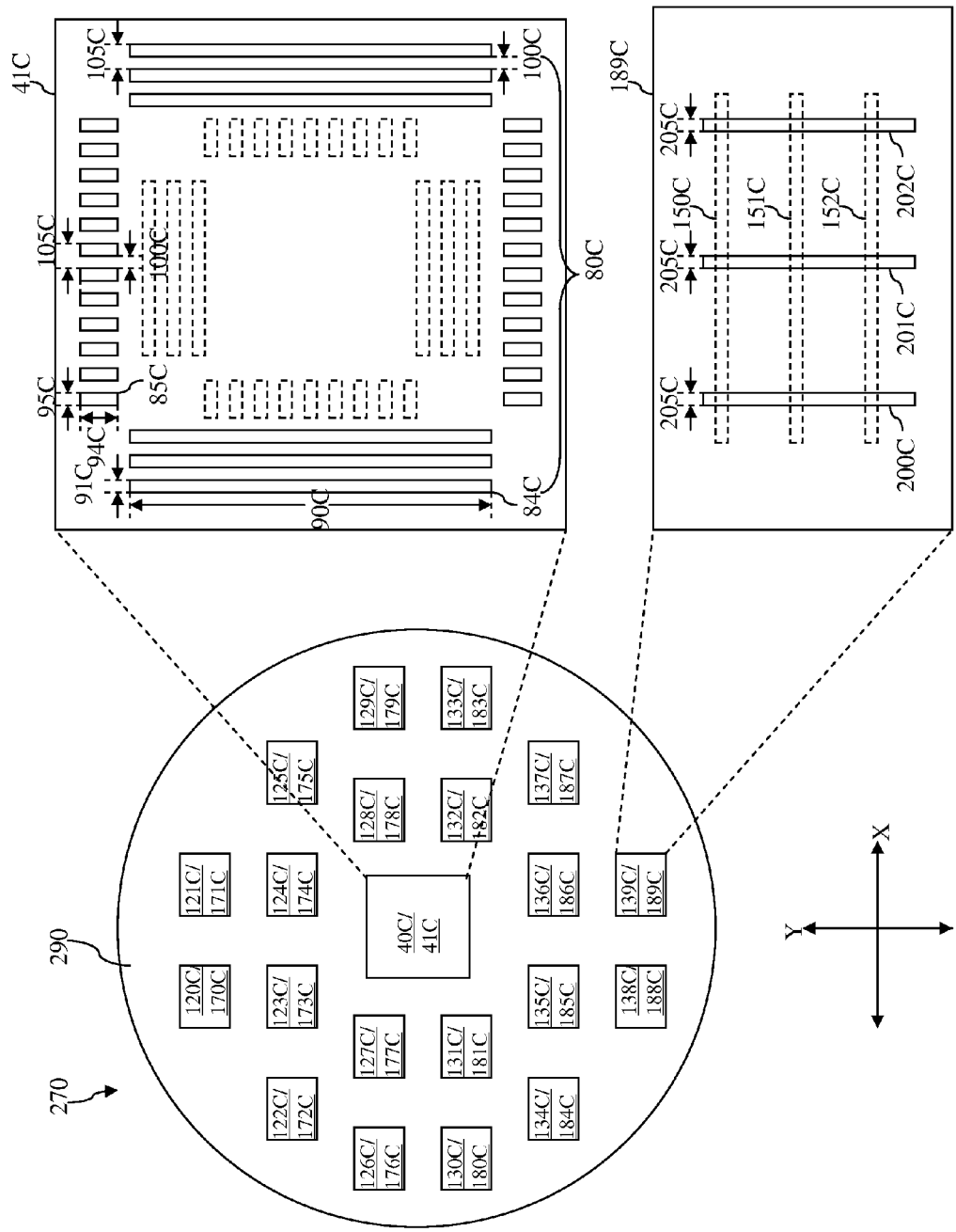

FIGS. 8-9 illustrate top views of a semiconductor wafer 270 (also referred to as a semiconductor substrate) at different stages of fabrication in accordance with an alternative embodiment of the method 11 of FIG. 1. Referring to FIG. 8, the wafer 270 is similar to the wafer 220 discussed above with reference to FIG. 5. The wafer 270 includes a layer 280. In a dipole photolithography process similar to the dipole photolithography process discussed above with reference to FIG. 5, the photomask 110 (FIG. 3) is used to form the overlay mark 40C and the patterns 120C-139C on the layer 280 of the wafer 230. This dipole photolithography process is performed using a dipole-Y aperture similar to the dipole-Y aperture 240 of FIG. 7A. It is understood that the physical dimensions of the patterns on the photomask 110 may not be equal to the physical dimensions of the corresponding patterns on the layer 280, though they may have a linear relationship. In an embodiment, the dimensions of the overlay mark 40C and the patterns 120C-139C in the layer 280 are approximately ¼ of the dimensions of the respective overlay mark 40A and the patterns 120A-139A on the photomask 110. Moreover, the overlay mark 40C and the patterns 120C-139C formed in the layer 280 may be concave (trenches) or convex (islands).

Referring now to FIG. 9, a layer 290 is formed over the layer 280. Alternatively stated, the wafer 270 includes two layers at this stage of fabrication: the layer 280 and the layer 290 that is disposed over the layer 280. The photomask 160 (FIG. 4) is used to form the overlay mark 41C and the patterns 170C-189C to the layer 290 of the wafer 270 through a dipole photolithography process that is similar to the dipole photolithography process discussed above with reference to FIG. 6. This dipole photolithography process is performed using a dipole-X aperture similar to the dipole-X aperture 250 of FIG. 7B.

In the embodiment shown in FIG. 9, the patterns 120C-139C and the patterns 170C-189C partially overlap, respectively. Further, the overlay mark 40C is surrounded (or encircled) by the overlay mark 41C. In this embodiment, the layer 280 is disposed below the layer 290, and therefore the patterns 40C and 120C-139C (formed in the layer 280) are disposed below the patterns 41C and 170C-189C (formed in the layer 290). To clarify this configuration, the features of the overlay mark 40C and the features 150C-152C are shown as broken lines. In other embodiments, the patterns 120C-139C and the patterns 170C-189C may not overlap, and the overlay mark 40C may be partially surrounded (or partially encircled) by the overlay mark 41C. It is understood that the physical dimensions of the patterns on the photomask 160 may not be equal to the physical dimensions of the corresponding patterns on the layer 290, though they may have a linear relationship. In an embodiment, the dimensions of the overlay mark 41C and the patterns 170C-189C in the layer 290 are approximately ¼ of the dimensions of the respective patterns of the photomask 160. Moreover, the overlay mark 41C and 170C-189C formed in the layer 290 may be concave (trenches) or convex (islands).

For reasons that are similar to those discussed above, the double dipole lithography process used in the embodiment in accordance with FIGS. 8-9 may improve the resolution of the features formed in the layers 280 and 290, and that an improved overlay error measurement may be obtained.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus comprising an overlay mark, the overlay mark including:
   a first portion that includes a plurality of first features, each of the first features having a first dimension measured in a first direction and a second dimension measured in a second direction that is approximately perpendicular to the first direction, the second dimension being greater than the first dimension; and
   a second portion that includes a plurality of second features, each of the second features having a third dimension measured in the first direction and a fourth dimension measured in the second direction, the fourth dimension being less than the third dimension;
   wherein at least one of the second features is partially surrounded by the plurality of first features in both the first and second directions, and wherein the first features are disposed in a first plane, and the second features are disposed in a second plane different from the first plane.

2. The apparatus of claim 1, wherein the apparatus further includes a semiconductor device having a first layer as the first plane and a second layer different from the first layer as the second plane.

3. The apparatus of claim 1, wherein the apparatus further includes first and second photomasks, wherein the first and second portions are respectively disposed within the first and second photomasks.

4. The apparatus of claim 3, wherein:
   the plurality of first features have a first pitch measured in the first direction;
   the plurality of second features have a second pitch measured in the second direction;
   the first photomask includes a third feature having a first size measured in the first direction;
   the second photomask includes a fourth feature having a second size measured in the second direction;
   the first pitch is correlated with the first size; and
   the second pitch is correlated with the second size.

5. The apparatus of claim 4, wherein the first pitch is approximately equal to twice the first size, and the second pitch is approximately equal to twice the second size.

6. The apparatus of claim 1, wherein the plurality of first features have a first pitch measured in the first direction, and the plurality of second features have a second pitch measured in the second direction, wherein the first and second pitches are each correlated with a critical dimension of a semiconductor fabrication technology, the critical dimension being measured in one of the first and second directions.

7. The apparatus of claim 6, wherein the first and second pitches are each equal to approximately twice the critical dimension.

8. The apparatus of claim 1, wherein the at least one of the second features is completely surrounded by the plurality of first features in both the first and second directions.

9. The apparatus of claim 1, wherein:
   a first subset of the first features have longer second dimensions than a second subset of the first features; and
   a first subset of the second features have longer third dimensions than a second subset of the second features.

10. An apparatus comprising:
    a first overlay mark having a group of elongated first gratings that each extend along a first axis, wherein the first gratings each have a first width that is approximately equal to a first distance separating adjacent first gratings, and wherein at least some of the first gratings are longer than other first gratings; and
    a second overlay mark having a group of elongated second gratings that each extend along a second axis that is approximately perpendicular to the first axis, wherein the second gratings each have a second width that is approximately equal to a second distance separating adjacent second gratings, and wherein at least some of the second gratings are longer than other second gratings;
    wherein the second overlay mark is partially encircled by the first overlay mark along both the first and second axes; and
    wherein the first gratings are formed in a first layer, and the second gratings are formed in a second layer different from the first layer.

11. The apparatus of claim 10, wherein the apparatus further includes a semiconductor device having the first layer in a first plane and the second layer in a second plane.

12. The apparatus of claim 10, wherein the apparatus further includes a first photomask and a second photomask, wherein the first overlay mark is located on the first photomask, and the second overlay mark is located on the second photomask.

13. The apparatus of claim 10, wherein:
the apparatus further includes a semiconductor device having a critical dimension measured along one of the first and second axes; and
the critical dimension is a function of one of the first width, the second width, the first distance, and the second distance.

14. A method of fabricating a semiconductor device, comprising:
providing a substrate that contains a first layer and a second layer different from the first layer;
forming a first portion of an overlay mark in the first layer of the substrate, the first portion including a plurality of first features, each of the first features having a first dimension measured in a first direction and a second dimension measured in a second direction that is approximately perpendicular to the first direction, the second dimension being greater than the first dimension; and
forming a second portion of the overlay mark in the second layer of the substrate, the second portion including a plurality of second features, each of the second features having a third dimension measured in the first direction and a fourth dimension measured in the second direction, the fourth dimension being less than the third dimension;
wherein the forming the first and second portions are carried out in a manner so that at least one of the second features is partially surrounded by the plurality of first features in both the first and second directions.

15. The method of claim 14, further including forming a semiconductor device in the substrate, the semiconductor device having a critical dimension measured in one of the first and second directions; and wherein:
the forming the first portion is carried out so that the first group of features have a first pitch measured in the first direction;
the forming the second portion is carried out so that the second group of features have a second pitch measured in the second direction; and
the critical dimension is a function of one of the first and second pitches.

16. The method of claim 14, wherein:
the providing the substrate is carried out so that the substrate includes a first photomask and a second photomask;
the forming the first portion is carried out so that the first portion is formed in the first photomask; and
the forming the second portion is carried out so that the second portion is formed in the second photomask.

17. The method of claim 14, wherein:
the forming the first portion includes performing a first dipole photolithography process that uses a first aperture, the first aperture having first openings that are approximately aligned in the first direction; and
the forming the second portion includes performing a second dipole photolithography process that uses a second aperture, the second aperture having second openings that are approximately aligned in the second direction.

18. The method of claim 14, wherein
a first subset of the first features have longer second dimensions than a second subset of the first features; and
a first subset of the second features have longer third dimensions than a second subset of the second features.

* * * * *